United States Patent [19]
Shimomura et al.

[11] Patent Number: 5,766,347
[45] Date of Patent: Jun. 16, 1998

[54] APPARATUS FOR FABRICATING A SEMICONDUCTOR SINGLE CRYSTAL

[75] Inventors: Koichi Shimomura; Yoshinobu Hiraishi; Mitsunori Kawabata, all of Omura, Japan

[73] Assignee: Komatsu Electronic Metals Co., Ltd., Hiratsuka, Japan

[21] Appl. No.: 803,774

[22] Filed: Feb. 24, 1997

[30] Foreign Application Priority Data

Feb. 24, 1996 [JP] Japan ................... 8-078425

[51] Int. Cl.$^6$ ................................................. C30B 35/00
[52] U.S. Cl. .................. 117/217; 117/200; 117/222; 117/900
[58] Field of Search ................... 117/200, 208, 117/213, 217, 220, 222, 900

[56] References Cited

U.S. PATENT DOCUMENTS

| | | | |
|---|---|---|---|
| 3,608,050 | 9/1971 | Carmen et al. | 117/223 |
| 5,116,456 | 5/1992 | Nester | 117/223 |
| 5,330,729 | 7/1994 | Oda et al. | 117/217 |
| 5,363,796 | 11/1994 | Kobayashi et al. | 117/217 |

FOREIGN PATENT DOCUMENTS

| | | |
|---|---|---|
| 2-0192486 | 7/1990 | Japan. |
| 4-0305087 | 10/1992 | Japan. |

*Primary Examiner*—Felisa Garrett
*Attorney, Agent, or Firm*—Varndell Legal Group

[57] ABSTRACT

An apparatus for fabricating a semiconductor single crystal, which make it possible to reduce the oxygen concentration of a pulling single crystal, to steadily dissolve the polysilicon material received in a crucible, and to minimize the cost and installation space, is provided.

The hollow cylindrical resistance heater of the apparatus, which co-axially surrounds a crucible, is provided with a ring-shaped slit excluding the location where at least two electrodes are formed, in a direction substantially perpendicular to the axial direction so as to divide the heater into an upper heating portion and a lower heating portion, and is provided with a plurality of vertical slits formed on the upper heating portion and the lower heating portion respectively, in a direction substantially parallel to the axial direction, wherein each vertical slit formed on the upper heating portion does not align with each vertical slit formed on the lower heating portion. The vertical slits formed on the upper heating portion and the slits formed on the lower heating portion have different pitches. The thickness or length of the upper heating portion is different from that of the lower heating portion.

5 Claims, 2 Drawing Sheets

1

APPARATUS FOR FABRICATING A SEMICONDUCTOR SINGLE CRYSTAL

BACKGROUND OF THE INVENTION

1. Field of the Invention

The present invention has as its object in general to reduce the oxygen concentration of a semiconductor single crystal fabricated by the Czochralski technique (hereinafter called CZ method), and relates to an apparatus for fabricating a semiconductor single crystal, which can steadily dissolve the polysilicon material received in a crucible.

2. Description of the Prior Art

As disclosed in Japan laid open patent application No. 4-305087, the heater 8 consists of an upper section, a medium section and a lower section, and the thickness of said upper section and said medium section is made to be thinner than said lower section, a heat generated by heating the resistances of said upper section and said medium section is made to be larger than that of the lower section, and a surface-level of a melt is positioned slightly lower than the center of said medium section so that the peak of a heat distribution is located slightly upper than the surface-level of the melt 6. Moreover, as disclosed in Japan laid open patent application No. 2-192486, between a crucible 2 and a heat insulation material 5, a side heater 3, and at the bottom of crucible 2, a bottom heater 4 are respectively provided. The output of the heaters 3 and 4 is independently controlled.

However, according to the above-mentioned conventional example, the technique disclosed in Japan laid open patent application No. 4-305087, in order to allow the peak of the heat distribution to be located at the upper portion of the resistance heater, the upper section of the heater is partially made thinner. And for that reason, the thinner portion of the upper section is converted to silicon carbide (SiC) or is remarkably eroded by oxidation due to SiO dust generated from the surface-level of the melt, thus shortening the life of the heater. Moreover, in the dissolution of polysilicon material received in a quartz crucible, the upper portion of the material is not dissolved and remains in the shape of a mushroom in a large quantity, while only the lower portion is dissolved. And therefore in the process of subsequent dissolution of the undissolved upper portion, when balance is lost and the undissolved upper portion drops, the quartz crucible may break, making it impossible to fabricate the semiconductor single crystal. Moreover, according to the technique as disclosed in Japan laid open patent application No. 2-192468, two independent heaters and power supplies are unitized and accordingly the fabrication apparatus itself is of a large scale, increasing the cost of apparatus for fabricating a semiconductor single crystal. In addition, since two sets of power supplies and controlling units for temperature are utilized, a larger installation space is required.

SUMMARY OF THE INVENTION

In view of the above-mentioned problems, an object of the present invention is to provide an apparatus for fabricating a semiconductor single crystal, which reduces the erosion due to the oxidation of the heating portion of the heater, lengthens the life of the heater and reduces the oxygen concentration of pulling single crystals. Moreover, by using the apparatus of the invention, it is also possible to steadily dissolve the polysilicon material received in a crucible, thereby minimizing the cost and installation space of the apparatus for fabricating semiconductor single crystal.

In order to attain the above object, according to the invention, the apparatus for fabricating a semiconductor single crystal is characterized in that the hollow cylindrical resistance heater thereof, which co-axially surrounds a crucible, is provided with a ring-shaped slit excluding the location where at least two electrodes are formed, in a direction substantially perpendicular to the axial direction so as to divide the heater into an upper heating portion and a lower heating portion, and is provided with a plurality of vertical slits formed on the upper heating portion and the lower heating portion respectively, in a direction substantially parallel to the axial direction, wherein each vertical slit formed on the upper heating portion does not align with each vertical slit formed on the lower heating portion.

Furthermore, the vertical slits formed on the upper heating portion and the slits formed on the lower heating portion have different pitches, and the thickness or length of the upper heating portion is different from that of the lower heating portion. Moreover, the lower heating portion has at least 4 electrodes.

Moreover, the heater has two common electrodes formed on the upper heating portion and the lower heating portion and two lower heating electrodes other than the two common electrodes, formed on the lower heating portion. Preferably, the apparatus for fabricating a semiconductor single crystal according to the invention includes a means for converting the current path corresponding to the case in which the current for heating is applied both between the two lower heating electrodes and between the two common electrodes, or only between the two common electrodes.

According to the apparatus for fabricating semiconductor single crystal of the invention, the upper heating portion and the lower heating portion divided by the ring-shaped slit and respectively provided with vertical slits are designed to be switched between the state wherein only the lower heating portion is heated and the state wherein four times the electric power of the lower heating portion is applied to the upper heating portion by the current path converting means. Accordingly, when the polysilicon material in the crucible is to be melted, only the lower heating portion is heated and thus the peak of the heating temperature distribution is shifted to the lower side of the crucible and the polysilicon material is steadily dissolved from the lower side. Moreover, when growing the single crystal, mainly the upper heating portion is used and thus the peak of the heating temperature is shifted to the upper side of the crucible, and accordingly making it possible to manufacture semiconductor single crystal with a low oxygen concentration.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENT

Figure 1:
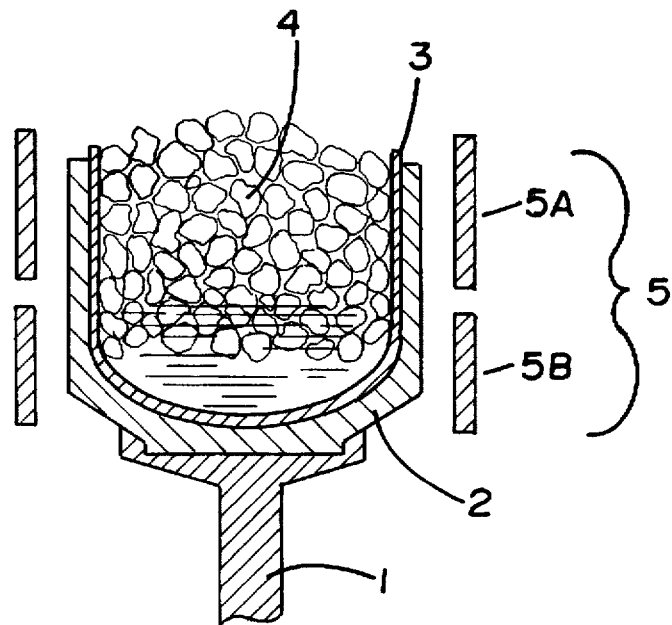
FIG. 1 is an side sectional view showing a preferred embodiment of the invention.
Figure 2:
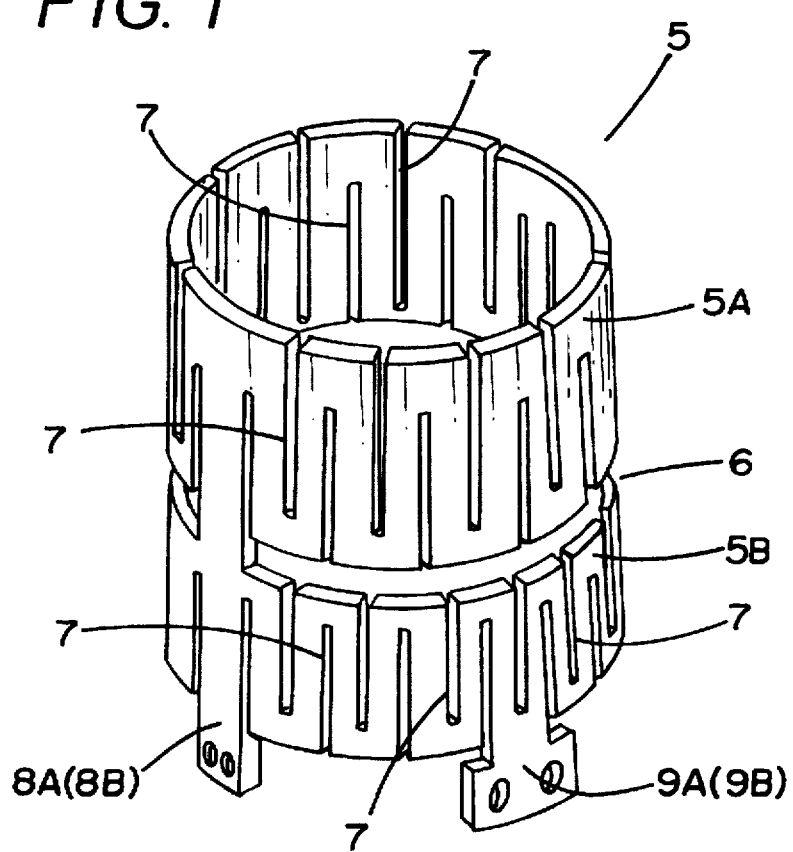
FIG. 2 is a perspective view showing the heater according to the preferred embodiment of the invention.

Referring to FIG. 1 which is a sectional view showing a quartz crucible filled with polysilicon material, which is the material of a semiconductor single crystal, of an apparatus for fabricating the semiconductor single crystal such as silicon according to the Czochralski technique (CZ method), a quartz crucible 3 is inserted and mounted in a graphite crucible 2 which is mounted on and supported by a crucible shaft 1 in a main chamber, and a polsilicon material 4 is filled in the quartz crucible 3. Cylindrical heater 5 is a hollow cylindrical heater which is co-axially mounted around the two crucibles 2 and 3 and is heated by resistance. As shown in FIG. 2, along the axial direction of the hollow cylindrical heater 5, excluding at where at least two electrodes (hereinafter called common electrodes) are formed, a ring-shaped slit 6 is provided in a direction substantially perpendicular to the axial direction, and by which the heater 5 is divided into an upper heating portion 5A and a lower heating portion 5B.

Furthermore, the upper heating portion 5A and the lower heating portion 5B are respectively provided with a plurality of vertical slits 7, in a direction substantially parallel to the axial direction, wherein each of the vertical slits 7 formed on the upper heating portion 5A does not align with each of the vertical slits formed on the lower heating portion 5B. Furthermore, in order to give each of the vertical slits 7 a different electrical resistance, the pitches of the vertical slits formed on the upper heating portion 5A and on the lower heating portion 5B are designed to be different. For example, the distance between any adjacent two of the vertical slits on the upper heating portion is equal to each other and the distance between any adjacent two of the vertical slits form on the lower heating portion is equal to each other and different from the distance between any two of the vertical slits formed on upper heating portion. In addition, in order to change the peaks of the heating temperature distribution between the upper heating portion SA and the lower heating portion 5B when the polysilicon material is dissolved and the single crystal is pulled, the thickness or length of the upper heating portion 5A is designed to be different from that of the lower heating portion 5B so as to make the heat generated by resistance be different.

Figure 3:
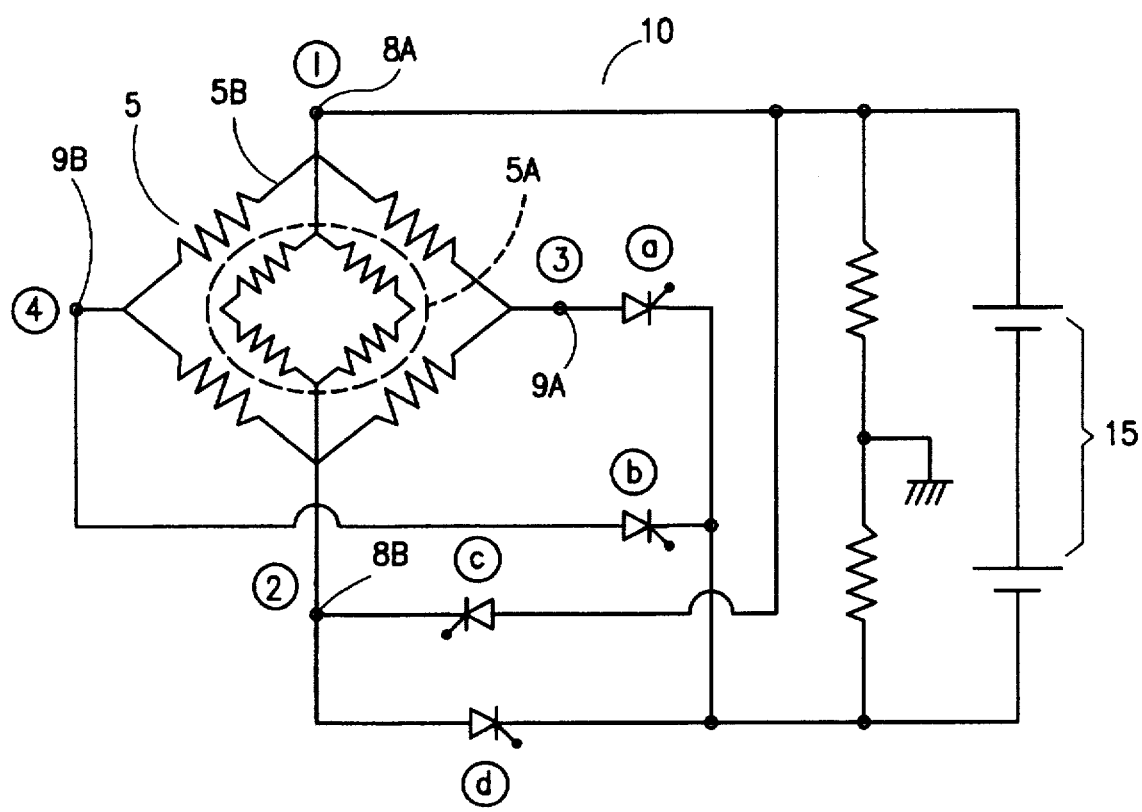
FIG. 3 is a schematic view illustrating the circuitry of the current converting means of the preferred embodiment of the invention.

The heater 5 has two common electrodes 8A, 8B formed on the upper heating portion 5A and the lower heating portion 5B, and two lower heating electrodes 9A, 9B other than the two common electrodes 8A, 8B, formed on the lower heating portion 5B. The apparatus for fabricating a semiconductor single crystal according to the invention includes a means 10 for converting current path corresponding to the case in which the current for heating is applied both between the two lower heating electrodes 9A, 9B and between the two common electrodes 8A, 8B, or only between the common electrodes 8A, 8B. Concretely, as shown in FIG. 3, the means 10 for converting current path is, for example, a means using a gate turn-off thyristor in which the lower heating electrodes 9A and 9B are connected by thyristors a, b, and the common electrodes 8A and 8B are connected with thyristors c, d. By switching the thyristors a, b, c, d according to Table 2 below, the current paths of the common electrodes 8A, 8B and lower heating electrodes 9A, 9B are changed according to Table 1 below when the polysilicon material is dissolved and pulled. 15 is the power supply for heating the heater 5.

TABLE 1

(current paths of the heater)

| electrodes | dissolving voltage | pulling voltage |
|---|---|---|
| 1 | +E | +E |
| 2 | +E | −E |
| 3 | −E | open |
| 4 | −E | open |

TABLE 2

(switching of gate turn-off thyristors)

| | dissolving | pulling |
|---|---|---|
| a | ON | OFF |
| b | ON | OFF |
| c | ON | OFF |
| d | OFF | ON |

That is, when polysilicon material P is to be dissolved, the common electrodes 8A and 8B are set on the same electric potential (+E), no current is applied to the upper heating portion 5A, and only lower heating portion 5B is heated; and when a single crystal is to be pulled, a electric potential difference (2E) is applied between the common electrode 8A and the common electrode 8B, the lower heating electrode 9A, 9B are in an open state, and the upper heating portion 5A and the lower heating portion 5B are set in a parallel-connected state. At this time, due to the difference of the length or thickness of the upper heating portion 5A and the lower heating portion 5B or the difference of the pitches of the vertical slits of the upper heating portion 5A and lower heating portion 5B, for example by making the electrical resistance of the upper heating portion 5A be smaller than that of the lower heating portion 5B, the heat generated by the upper heating portion 5A will be greater than that of the lower heating portion 5B, and as a result the peak position of the heating temperature distribution is shifted to the upper side.

EXAMPLE

Figure 4:
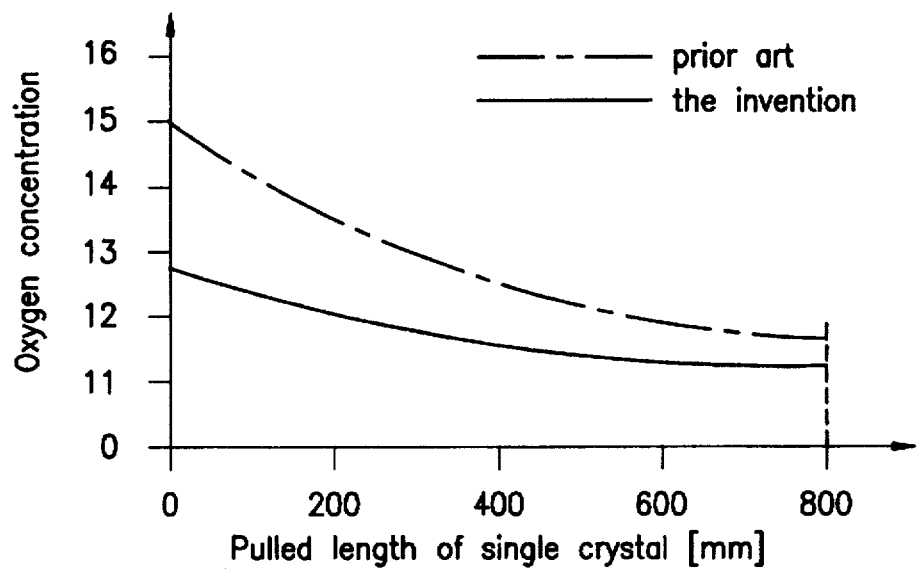
FIG. 4 is a graph showing the relationship between the pulling length of single crystal and the oxygen concentration by using the apparatus of the invention and the prior art apparatus.

In this example, the apparatus of the invention was used to fabricate semiconductor single crystals wherein the upper heating portion 5A and lower heating portion 5B utilizes a power supply 15 having an output of 150 kW when the loading is 25 mΩ, the upper heating portion 5A and the lower heating portion 5B, which form the heater 5, have an outer diameter of 620 mm and an inner diameter of 576 mm, the length of the upper heating portion 5A is 260 mm, the length of the lower heating portion 5B is 220 mm, the width of the ring-shaped slit 6 is 20 mm, the resistance between the terminals of the common electrodes 8A and 8B is 20 mΩ, the resistance between the terminals between the common electrodes 8A, 8B and lower heating electrodes 9A, 9B is 25 mΩ, the pitches of the vertical slits 7 of the lower heating portion 5B is ½ of that of the upper heating portion 5A, the thickness of the lower heating portion 5B is ½ of the upper heating portion 5A and the electrical resistance of the lower heating portion 5B is 4 times that of the upper heating portion 5A, and thus the heat generated by the upper heating portion 5A is 4 times that of the lower heating portion 5B. The oxygen concentrations and the pulling lengths of the obtained single crystals according to this example were shown in FIG. 4. As shown in FIG. 4, single crystals having low oxygen concentrations are obtained. Concretely, while the polysilicon material 4 was dissolved, a voltage of +28V was applied to the common electrodes 8A, 8B and a voltage of −28V was applied to the lower heating portion electrodes 9A, 9B, and the lower heating portion 5B consumed 125 kW and as a result, the polysilicon material 4 was steadily dissolved. Moreover, when the polysilicon material 4 was pulled, a voltage of +21V was applied to the common electrode 8A, a voltage of −21V was applied to the common electrode 8B and the upper heating portion 5A consumed 71 kW, the lower heating portion 5B consumed 17 kW and as a result, semiconductor single crystals were steadily pulled. In this example, the charge amount of the raw material was 75 kg, the outer diameter of the pulled single crystal was 206 mm and the weight of the pulled single crystal was 68 kg.

Moreover, in the above example the parameters were set as above, however, as long as the oxygen concentrations of the pulling single crystals can be kept at a lower level and the polysilicon material 4 received in the crucible can be steadily dissolved, these parameters need not necessarily be set as above.

The apparatus of the invention has the above structure, and in particular when the polysilicon material in the crucible is to be melted, only the lower heating portion is heated, thus allowing the polysilicon material be dissolved from the lower side. Moreover, when growing the single crystal, the peak of the heating temperature is shifted to the upper side of the crucible and the upper heating portion is applied with a large amount of electrical power, and thus making it possible to manufacture semiconductor single crystals with a low oxygen concentration, to reduce the erosion of a heater due to oxidation, and to lengthen the life of the heater. Furthermore, the apparatus itself can be manufactured at a lower cost and the installation space can be minimized.

What is claimed is:

1. An apparatus for fabricating a semiconductor single crystal having a hollow cylindrical resistance heater, characterized in that the hollow cylindrical resistance heater, which coaxially surrounds a crucible, is provided with a ring-shaped slit excluding the location where at least two electrodes are formed, in a direction substantially perpendicular to the axial direction so as to divide the heater into an upper heating portion and a lower heating portion, and is provided with a plurality of vertical slits formed on the upper heating portion and the lower heating portion respectively, in a direction substantially parallel to the axial direction, wherein each vertical slit formed on the upper heating portion does not align with each vertical slit formed on the lower heating portion.

2. The apparatus as claimed in claim 1, wherein distance between any adjacent two of the vertical slits formed on said upper heating portion is equal to each other and distance between any adjacent two of the vertical slits formed on said lower heating portion is equal to each other and different from the distance between adjacent two of the vertical slits formed on said upper heating portion.

3. The apparatus as claimed in claim 1, wherein the thickness or length of said upper heating portion is different from the thickness or length of said lower heating portion.

4. The apparatus as claimed in claim 1, wherein said lower heating portion has at least 4 electrodes.

5. The apparatus as claimed in claim 4, wherein said heater has two common electrodes formed on said upper heating portion and said lower heating portion and two lower heating electrodes other than said two common electrodes, formed on the lower heating portion; and further comprising a means for converting the current path corresponding to the case in which the current for heating is applied both between said two lower heating electrodes and between said two common electrodes, or only between said two common electrodes.

* * * * *